United States Patent
Chu et al.

(12) 
(10) Patent No.: US 6,376,259 B1
(45) Date of Patent: Apr. 23, 2002

(54) METHOD FOR MANUFACTURING A FERROELECTRIC MEMORY CELL INCLUDING CO-ANNEALING

(75) Inventors: Fan Chu; Glen Fox, both of Colorado Springs, CO (US)

(73) Assignee: Ramtron International Corporation, Colorado Springs, CO (US)

( * ) Notice: Subject to any disclaimer, the term of this patent is extended or adjusted under 35 U.S.C. 154(b) by 0 days.

(21) Appl. No.: 09/816,425

(22) Filed: Mar. 21, 2001

(51) Int. Cl.⁷ .............................................. H01L 21/00
(52) U.S. Cl. ......................................................... 438/3
(58) Field of Search ............................ 438/3, 240, 393, 438/396

(56) References Cited

U.S. PATENT DOCUMENTS

| | | |
|---|---|---|
| 3,935,083 A | 1/1976 | Tomozawa et al. |
| 5,024,964 A | 6/1991 | Rohrer et al. |
| 5,031,144 A | 7/1991 | Persky |
| 5,266,821 A | 11/1993 | Chern et al. |
| 5,338,951 A | 8/1994 | Argos, Jr. et al. |
| 5,350,705 A | 9/1994 | Brassington et al. |
| 5,372,859 A | * 12/1994 | Thakoor |
| 6,322,849 B2 | * 11/2001 | Joshi et al. |
| 2001/0023103 A1 | * 9/2001 | Yang et al. |

FOREIGN PATENT DOCUMENTS

| | | |
|---|---|---|
| EP | 0 449 484 A1 | 2/1991 |
| EP | 0 415 751 A1 | 6/1991 |
| JP | 01-81070 | 1/1991 |
| JP | 3-293093 | 1/1993 |
| JP | 04-60034 | 1/1994 |

OTHER PUBLICATIONS

"Low–Temperature Fabrication of Amorphous BaTiO₃ Thin–Film Bypass Capacitors," W. T.. Liu, et al., vol. 14, No. 7, Jul. 1993, © IEEE, pp. 320–322.

* cited by examiner

Primary Examiner—Keith Christianson
(74) Attorney, Agent, or Firm—William J. Kubida; Carol W. Burton; Hogan & Hartson, LLP

(57) ABSTRACT

A method for manufacturing a ferroelectric memory cell includes the steps of forming a bottom electrode layer on a substrate, forming a ferroelectric thin film layer on the bottom electrode layer, forming a top electrode on the ferroelectric thin film layer, forming an encapsulating layer on the top electrode, forming a contact hole through the encapsulating layer, and co-annealing the ferroelectric thin film layer and the top electrode after forming the contact hole.

21 Claims, 3 Drawing Sheets

METHOD FOR MANUFACTURING A FERROELECTRIC MEMORY CELL INCLUDING CO-ANNEALING

BACKGROUND OF THE INVENTION

1. Field of the Invention

The present invention relates to a FRAM (Ferroelectric Random Access Memory), and more particularly, to a method of forming a ferroelectric memory cell having reduced line degradation.

2. Discussion of the Related Art

FRAM (ferroelectric random access memory) is a type of non-volatile read/write random access semiconductor memory. FRAM combines the advantages of SRAM (static random access memory), which has a fast writing speed, and EAROM (electrically alterable read-only memory), which are non-volatility and in-circuit programmability.

A ferroelectric memory cell consists of a ferroelectric capacitor and a transistor. The properties of a dielectric material in the FRAM provide special advantages. The dielectric material has a high dielectric constant and can be polarized by an electric field. The polarisation remains until it is reversed by an opposite electrical field. This makes the memory non-volatile.

In the FRAM integration process, the ferroelectric thin film can be damaged by some processes, such as top electrode etching, ferroelectric thin film etching and bottom electrode etching processes, resulting in severely degraded ferroelectric performance, especially concerning imprint performance.

Usually, a recovery annealing process in an oxygen atmosphere is applied after the bottom electrode etching process to eliminate damage received from the bottom electrode etching process. Similarly, after top electrode etching process, the ferroelectric thin film is annealed in an oxygen atmosphere to eliminate damage received from the top electrode etching process.

All these recovery annealing processes increase the complexity of FRAM integration process, and consequently increase the cost of FRAM device. In addition, the temperature for recovery annealing is difficult to chose. In the case where PLZT is used for the ferroelectric thin film, if the annealing temperature is too high, the Pb loss during the annealing causes degradation in the ferroelectric performance, especially in fatigue performance. If the annealing temperature is too low, the damage from the etching process may not be fully recovered so that the ferroelectric performance, especially the imprint performance, is affected. Also, the recovery annealing after each of the etching processes are usually carried out at temperatures lower than PLZT grain growth temperature. Therefore, these annealing processes will not change the grain structure much and there will be little vacancy diffusion generated during the annealing. The recovery from the damage caused by the etch process is consequently limited.

SUMMARY OF THE INVENTION

Accordingly, the present invention is directed to a ferroelectric memory cell that substantially obviates one or more of the problems due to limitations and disadvantages of the related art.

An object of the present invention is to provide a ferroelectric memory cell having improved ferroelectric performance.

Another object of the present invention is to provide a ferroelectric device having reduced line degradation.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for manufacturing a ferroelectric memory cell includes the steps of forming a bottom electrode layer on a substrate, forming a ferroelectric thin film layer on the bottom electrode layer, forming a top electrode on the ferroelectric thin film layer, forming an encapsulating layer on the top electrode, forming a contact hole through the encapsulating layer, and co-annealing the ferroelectric thin film layer and the top electrode after forming the contact hole.

In another aspect of the present invention, a method for manufacturing a ferroelectric memory cell includes the steps of forming a bottom electrode layer on a substrate, forming a ferroelectric thin film layer on the bottom electrode layer, forming a top electrode on the ferroelectric thin film layer, forming an encapsulating layer on the top electrode, forming a contact hole through the encapsulating layer, and annealing the ferroelectric thin film layer for grain growth after forming the contact hole.

In another aspect of the present invention, a method for manufacturing a ferroelectric memory cell includes the steps of forming a bottom electrode layer on a substrate, forming a ferroelectric thin film layer on the bottom electrode, forming a top electrode layer on the ferroelectric thin film layer, etching the top electrode layer to form a top electrode, etching the ferroelectric thin film layer, etching the bottom electrode layer to form a bottom electrode, and co-annealing the ferroelectric thin film layer and the top electrode to recover from damages received from the etching processes.

In another aspect of the present invention, a method for manufacturing a ferroelectric memory cell includes the steps of forming a bottom electrode layer on a substrate, forming a ferroelectric thin film layer on the bottom electrode layer, annealing the ferroelectric thin film layer for crystallization, forming a top electrode on the ferroelectric thin film layer, forming an encapsulation layer over the top electrode, etching the bottom electrode layer to form a bottom electrode, forming a dielectric layer on the encapsulation layer, forming a contact hole through the dielectric layer and the encapsulating layer, and co-annealing the ferroelectric thin film layer and the top electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiment of the present invention, examples of which are illustrated in the accompanying drawings.

Figure 1:
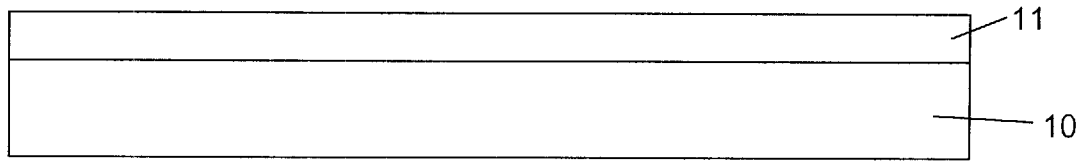
FIGS. 1–7 are sequential sectional views of a ferroelectric device according to the present invention.

FIG. 1 shows an integrated circuit substrate, preferably including a semiconductor silicon wafer 10 and a bottom electrode layer 11 deposited thereon. The bottom electrode layer 11, preferably made of Pt (platinum), Ir (iridium), or IrOx (iridium oxide), for example, can be deposited by sputtering or CVD (chemical vapor deposition).

Figure 2:
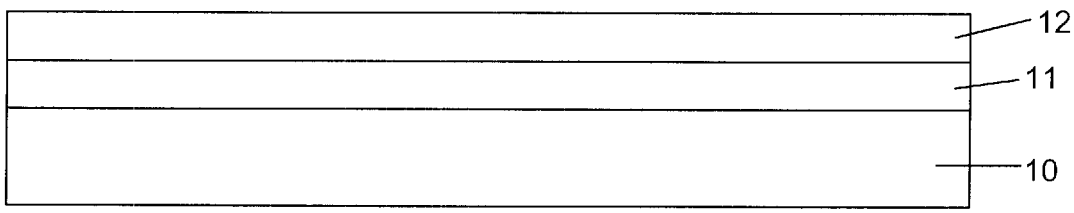

Thereafter, a ferroelectric thin film layer 12 is deposited on the bottom electrode layer 11, as shown in FIG. 2. Preferably, the ferroelectric thin film layer 12 is formed of a ferroelectric material having a ceramic ferroelectric with a perovskite structure, such as PZT (lead zirconate titanate) or PLZT (lead lanthanum zirconate titanate). The ferroelectric thin film layer 12 can be deposited by sputtering, chemical solution deposition (CSD or Sol-gel), or metal organic chemical vapor deposition (MOCVD). After the ferroelectric thin film layer 12 is deposited, a first annealing process is performed to crystallize the ferroelectric thin film 12. The first annealing process includes a heat treatment, preferably in a temperature ranging between 500° C. and 650° C., in an atmosphere of Ar or any inert gas mixed with $O_2$. In this embodiment, PLZT is used for the ferroelectric thin film, as an example.

Figure 3:
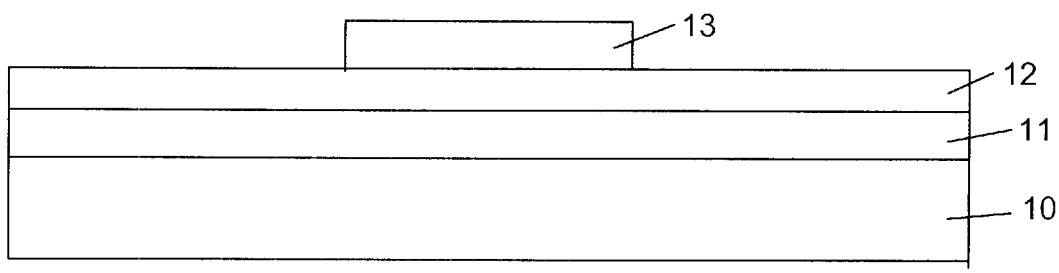
Figure 4:
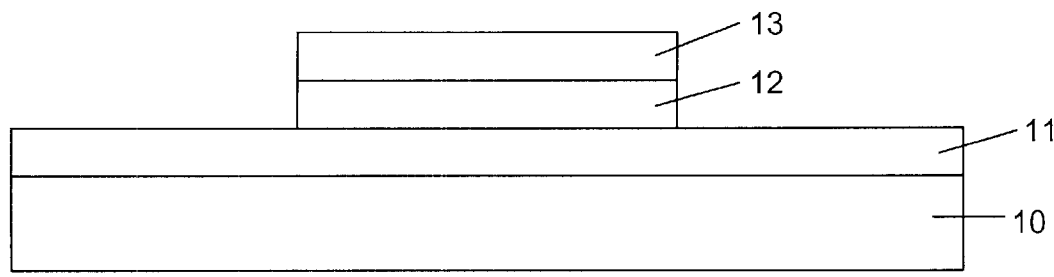

Thereafter, a top electrode layer 13 is deposited over the PLZT layer 12. The top electrode layer 13, preferably made of Pt (platinum), Ir (iridium), or IrOx (iridium oxide), for example, can be deposited by sputtering or CVD. The top electrode layer 13 is etched, using a photoresist film pattern (not shown), to form a top electrode 13, as shown in FIG. 3. Thereafter, the PLZT layer 12 is etched, as shown in FIG. 4.

Figure 5:
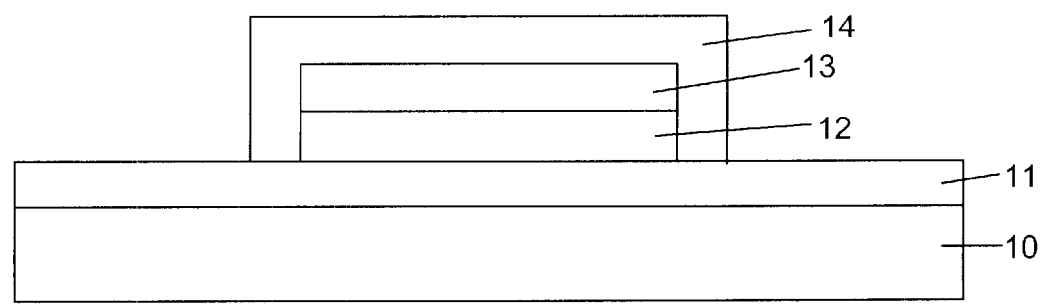

Thereafter, an encapsulation layer 14 is deposited over the bottom electrode layer 11, covering the top electrode 13 and the ferroelectric thin film 12 to protect the ferroelectric thin film during the bottom electrode layer etching process, as shown in FIG. 5.

Figure 6:
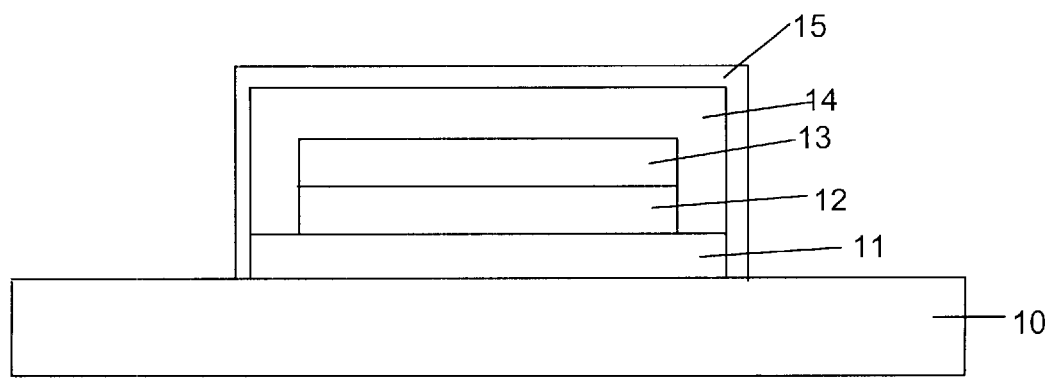

After the encapsulating layer 14 is formed, the bottom electrode layer 11 is etched, using a photoresist film pattern (not shown) to form a bottom electrode 11. Thereafter, a dielectric layer 15, such as SiOx layer, is formed on the encapsulating layer 14, as shown in FIG. 6.

Figure 7:
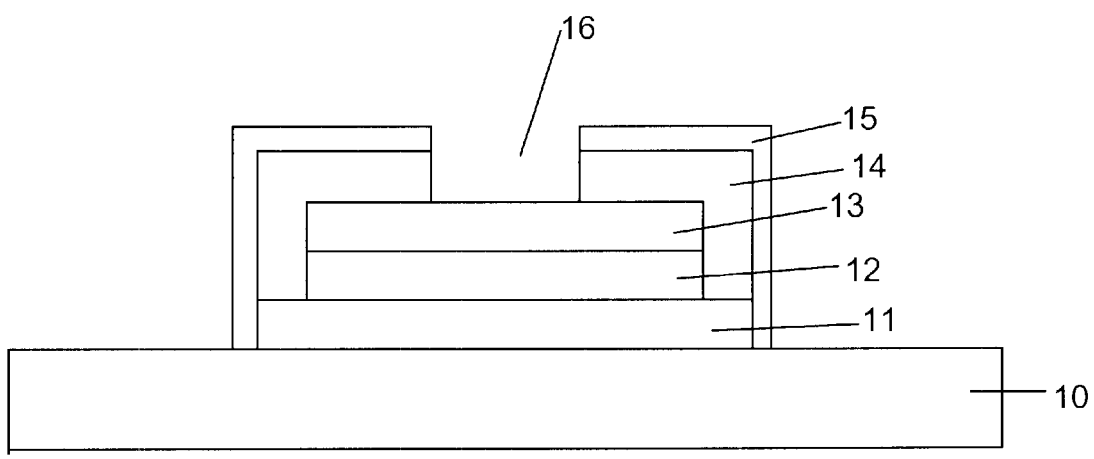

FIG. 7 shows a contact hole 16 that is etched to provide access to the top electrode 13. The contact hole 16 is etched through the dielectric layer 15 and the encapsulation layer 14 to allow metalization of the top electrode.

Thereafter, a ferroelectric thin film/top electrode co-annealing process is conducted. The ferroelectric thin film/top electrode co-annealing process serves as a ferroelectric grain growth annealing process and a recovery annealing process. The ferroelectric thin film/top electrode co-annealing includes a heat treatment, preferably in a temperature ranging between 650° C. and 750° C., which is higher than the first annealing temperature, in an atmosphere of $O_2$ or any inert gas mixed with $O_2$.

The ferroelectric grain growth annealing process needs to be carried out with a dense top electrode, such as IrOx on top of the PLZT thin film. The dense top electrode will preserve Pb in the PLZT film during grain growth so that the Pb gradient in the annealed PLZT film will be eliminated. For array capacitors of which the size is usually in micron range and sub-micron range, the Pb loss from the lateral side of the capacitors becomes important. In the present invention, by conducting the ferroelectric thin film/top electrode co-annealing process after forming the contact hold, this type of Pb loss can be prevented because the array capacitors are protected by the encapsulation layer and SiOx layer.

By conducting the ferroelectric grain growth annealing process after forming the contact hole, the damages from the etching processes can be better recovered because the ferroelectric grain growth process is basically a mass transfer of solid phase, which generates high level of vacancy diffusion in order to complete the grain growth. The high level of vacancy diffusion that leads to the change in grain structure also cleans the damage received from the etching process, resulting in a better ferroelectric performance. Before the ferroelectric grain growth annealing process, there were no clearly defined ferroelectric grains and a large amount of tiny pores existed in the film. After the ferroelectric grain growth annealing process, well developed ferroelectric grains can be observed and the grains form a typical columnar structure. X-ray diffraction analysis indicates that the ferroelectric thin film is fully crystallized before the ferroelectric grain growth annealing process because there is practically no change in volume fraction of the film texture between before and after the ferroelectric grain growth annealing process. After the ferroelectric grain growth process, the whole system is in a lower free energy state and the microstructure of the ferroelectric thin film is changed. Another advantage of the present invention is that the recovery annealing processes that are usually conducted after each of the top electrode etching process, the ferroelectric layer etching process, and the bottom electrode etching process can be eliminated, since the ferroelectric thin film grain growth annealing process can serve as an effective recovery annealing process, thereby reducing the manufacturing cost.

It will be apparent to those skilled in the art that various modifications and variations can be made in the method for manufacturing a ferroelectric memory cell of the present invention without departing from the spirit or scope of the invention. Thus, it is intended that the present invention covers the modifications and variations of this invention provided that they come within the scope of any claims and their equivalents.

What is claimed is:

1. A method for manufacturing a ferroelectric memory cell comprising the steps of:

forming a bottom electrode layer on a substrate;

forming a ferroelectric thin film layer on the bottom electrode layer;

forming a top electrode on the ferroelectric thin film layer;

forming an encapsulating layer on the top electrode;

forming a contact hole through the encapsulating layer; and co-annealing the ferroelectric thin film layer and the top electrode after forming the contact hole.

2. The method for manufacturing a ferroelectric memory cell according to claim 1, wherein the bottom electrode layer is formed by sputtering or chemical vapor deposition (CVD).

3. The method for manufacturing a ferroelectric memory cell according to claim 1, wherein the bottom electrode layer comprises one of Pt (platinum), Ir (iridium), and IrOx (iridium oxide).

4. The method for manufacturing a ferroelectric memory cell according to claim 1, wherein the ferroelectric thin film layer includes ceramic ferroelectric with a perovskite structure.

5. The method for manufacturing a ferroelectric memory cell according to claim 1, wherein the ferroelectric thin film layer includes PZT (lead zirconate titanate) or PLZT (lead lanthanum zirconate titanate).

6. The method for manufacturing a ferroelectric memory cell according to claim 1, wherein the ferroelectric thin film layer is formed by one of sputtering, chemical solution deposition (CSD or Sol-gel), and metal organic chemical vapor deposition (MOCVD).

7. The method for manufacturing a ferroelectric memory cell according to claim 1, wherein the top electrode comprises one of Pt (platinum), Ir (iridium), and IrOx (iridium oxide).

8. The method for manufacturing a ferroelectric memory cell according to claim 1, wherein the method further comprises the step of annealing the ferroelectric thin film layer for crystallization before forming the top electrode.

9. The method for manufacturing a ferroelectric memory cell according to claim 8, wherein annealing temperature is in a range between 500° C. and 650° C.

10. The method for manufacturing a ferroelectric memory cell according to claim 9, wherein the annealing is conducted in an atmosphere of Ar or any inert gas mixed with $O_2$.

11. The method for manufacturing a ferroelectric memory cell according to claim 1, wherein co-annealing temperature for co-annealing the ferroelectric thin film layer and the top electrode is in a range between 650° C. and 750° C.

12. The method for manufacturing a ferroelectric memory cell according to claim 1, wherein the co-annealing is conducted in an atmosphere which includes at least a mixture of $O_2$.

13. The method for manufacturing a ferroelectric memory cell according to claim 1, wherein the method further comprises the step of forming a dielectric layer on the encapsulation layer before forming the contact hole.

14. The method for manufacturing a ferroelectric memory cell according to claim 13, wherein the method further comprises the step of etching the bottom electrode layer before forming the dielectric layer on the encapsulation layer.

15. A method for manufacturing a ferroelectric memory cell comprising the steps of:
   forming a bottom electrode layer on a substrate;
   forming a ferroelectric thin film layer on the bottom electrode layer;
   forming a top electrode on the ferroelectric thin film layer;
   forming an encapsulating layer on the top electrode;
   forming a contact hole through the encapsulating layer; and
   annealing the ferroelectric thin film layer for grain growth after forming the contact hole.

16. The method for manufacturing a ferroelectric memory cell according to claim 15, wherein annealing temperature for annealing the ferroelectric thin film layer is in a range between 650° C. and 750° C.

17. The method for manufacturing a ferroelectric memory cell according to claim 15, wherein annealing atmosphere for annealing the ferroelectric thin film layer includes at least a mixture of $O_2$.

18. A method for manufacturing a ferroelectric memory cell comprising the steps of:
   forming a bottom electrode layer on a substrate;
   forming a ferroelectric thin film layer on the bottom electrode layer;
   forming a top electrode layer on the ferroelectric thin film layer;
   etching the top electrode layer to form a top electrode;
   etching the ferroelectric thin film layer;
   etching the bottom electrode layer to form a bottom electrode; and
   co-annealing the ferroelectric thin film layer and the top electrode to recover from damages received from the etching processes.

19. The method for manufacturing a ferroelectric memory cell according to claim 18, wherein co-annealing temperature for co-annealing the ferroelectric thin film layer and the top electrode is in a range between 650° C. and 750° C.

20. The method for manufacturing a ferroelectric memory cell according to claim 18, wherein co-annealing atmosphere for co-annealing the ferroelectric thin film layer and the top electrode is $O_2$ or any inert gas mixed with $O_2$.

21. A method for manufacturing a ferroelectric memory cell comprising the steps of:
   forming a bottom electrode layer on a substrate;
   forming a ferroelectric thin film layer on the bottom electrode layer;
   annealing the ferroelectric thin film layer for crystallization;
   forming a top electrode on the ferroelectric thin film layer;
   forming an encapsulation layer over the top electrode;
   etching the bottom electrode layer to form a bottom electrode;
   forming a dielectric layer on the encapsulation layer;
   forming a contact hole through the dielectric layer and the encapsulating layer; and
   co-annealing the ferroelectric thin film layer and the top electrode.

* * * * *